United States Patent [19]

Mori et al.

[11] Patent Number: 5,059,506
[45] Date of Patent: Oct. 22, 1991

[54] METHOD OF IMAGE FORMATION

[75] Inventors: Hiroshi Mori, Chiba; Toshiaki Kobayashi, Nara; Shoichi Nagata, Nara; Kunio Ohashi, Nara, all of Japan

[73] Assignee: Sharp Kabushiki Kaisha, Osaka, Japan

[21] Appl. No.: 532,344

[22] Filed: Jun. 1, 1990

Related U.S. Application Data

[63] Continuation of Ser. No. 297,588, Jan. 13, 1989, abandoned.

[30] Foreign Application Priority Data

Jan. 14, 1988 [JP] Japan ................................. 63-6674

[51] Int. Cl.$^5$ ............................................. G03C 1/72
[52] U.S. Cl. ................................... 430/138; 430/235; 430/363
[58] Field of Search ............................ 430/138, 235, 365

[56] References Cited

U.S. PATENT DOCUMENTS

| | | | |
|---|---|---|---|
| 3,867,150 | 2/1975 | Ketley | 430/138 |
| 4,576,891 | 3/1986 | Adair et al. | 430/926 |
| 4,806,446 | 2/1989 | Hatta et al. | 430/138 |
| 4,810,614 | 3/1989 | Sangyoji et al. | 430/138 |
| 4,821,072 | 4/1989 | Nagumo | 430/138 |
| 4,904,563 | 2/1990 | Aoai et al. | 430/138 |

FOREIGN PATENT DOCUMENTS 3036253  2/1988  Japan .

Primary Examiner—Hoa Van Le
Attorney, Agent, or Firm—Irell & Manella

[57] ABSTRACT

Image-forming light from a light source is projected to form a latent image with color information on a photosensitive sheet having a surface coated with microcapsules each containing a light-curable agent sensitive to light in a wavelength range corresponding to blue, green or red and a specified chromogenic agent which produces yellow, magenta or cyanic. An image transfer sheet with a surface coated with a developing agent having chromogenic effects on these encapsulated chromogenic agents is superposed on such a photosensitive sheet with a latent image formed thereon by selectively hardened microcapsules and these sheets are compressed together to rupture only those of the microcapsules which have not been hardened. The emission characteristics of the lamp used as the light source are such that the emission intensity is concentrated in wavelength ranges where the light-curable agents have peak photosensitivities.

3 Claims, 3 Drawing Sheets

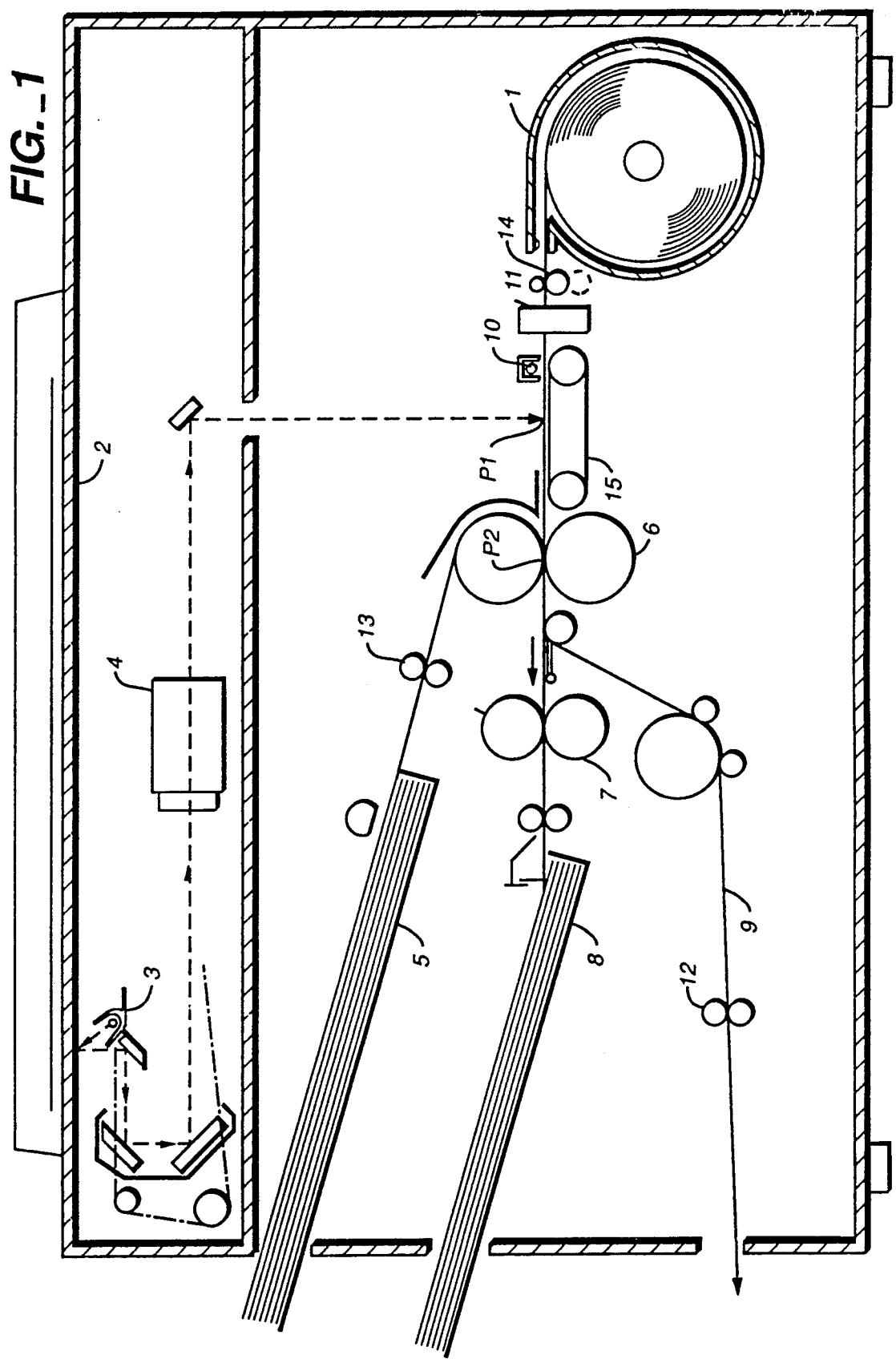
FIG._1

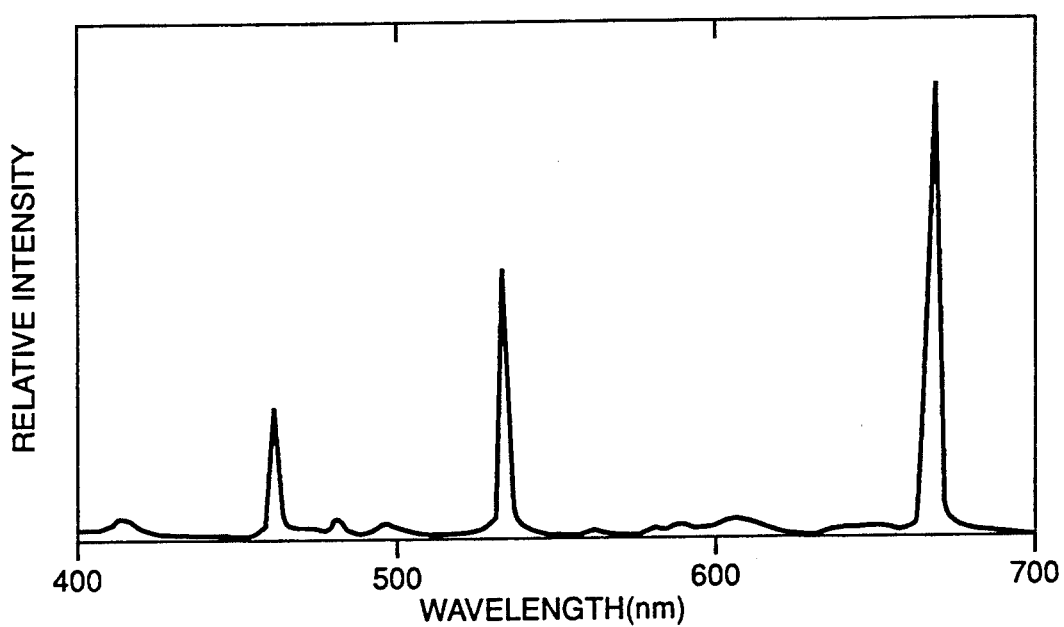
FIG._2
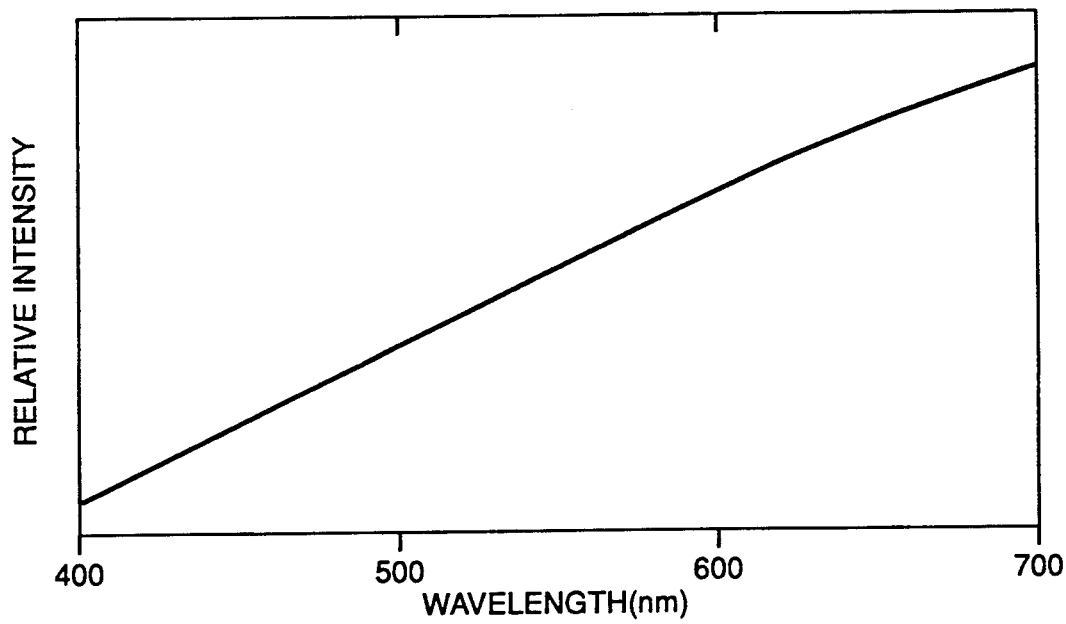
FIG._4
(PRIOR ART)

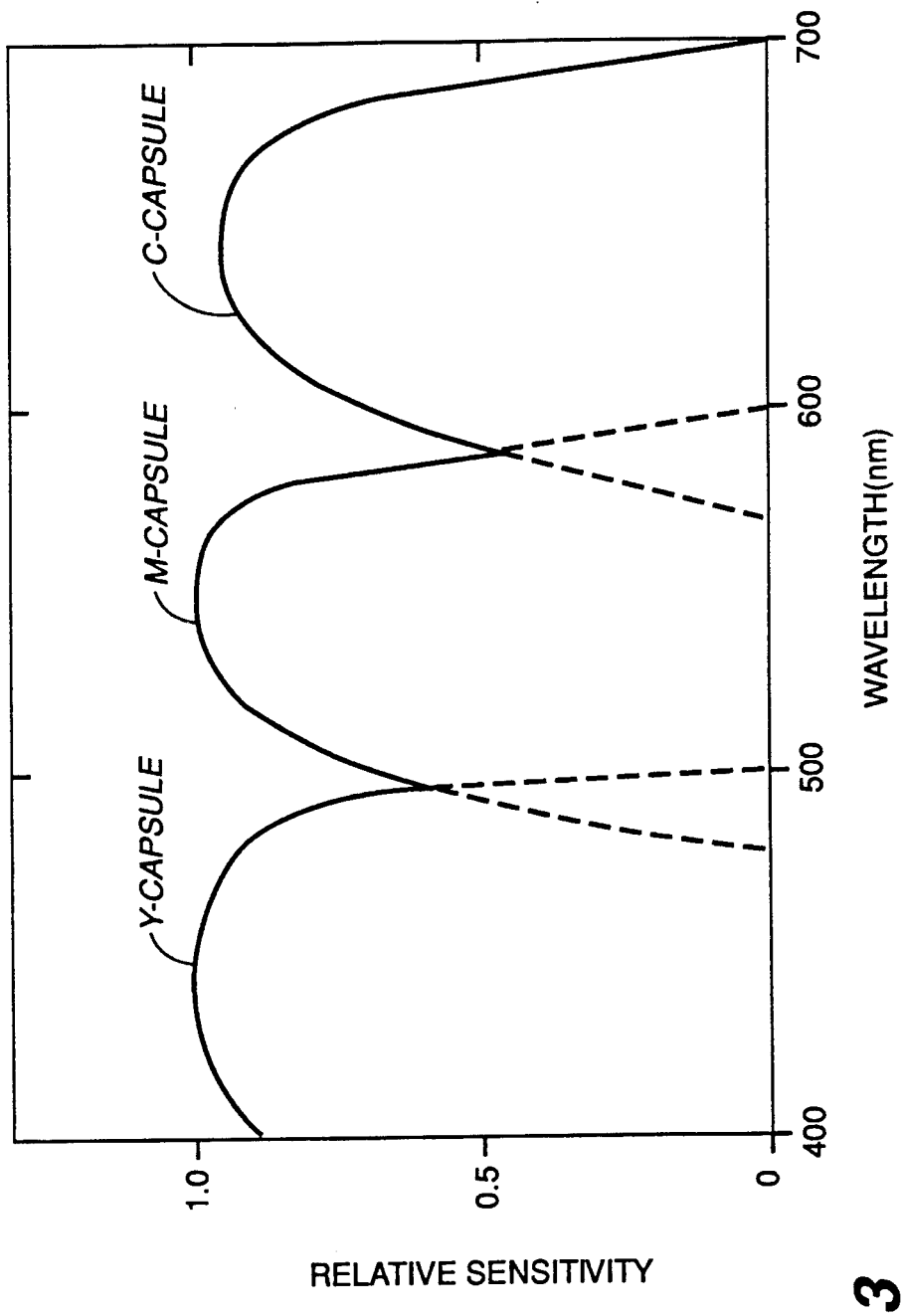
FIG._3

METHOD OF IMAGE FORMATION

This is a continuation of application Ser. No. 297,588 filed Jan. 13, 1989, to be abandoned.

BACKGROUND OF THE INVENTION

This invention relates to a method of forming a color image by superposing one on top of the other a photosensitive sheet with one surface coated with microcapsules encapsulating a chromogenic agent capable of producing a specified color and a light-curable agent which hardens upon exposure to light within a specified wavelength range and an image transfer sheet with one surface coated with a developing agent having a chromogenic effect on this chromogenic agent and compressing these sheets together.

Japanese Patent Publication Tokkai 58-88739 disclosed a method of image formation by using a photosensitive sheet having a sheet-like transparent base material coated with microcapsules encapsulating a specified colorless dye (a chromogenic agent) and a light-curable agent which hardens upon exposure to light. If such a photosensitive sheet is exposed to image-forming light such as reflected light from a document, only those of the microcapsules on the photosensitive sheet which are exposed to light are hardened such that a latent image is formed on the photosensitive sheet corresponding to the image on the exposed document. If a photosensitive sheet with a latent image thus formed thereon is superposingly covered by an image transfer sheet with a surface coated with a developing agent having a chromogenic effect on the colorless dye encapsulated inside the microcapsules and if these sheets are compressed together, those of the microcapsules which are not hardened are ruptured, causing the encapsulated colorless dye to flow out thereof. The colorless dye flowing out of the ruptured microcapsules reacts with the developing agent on the image transfer sheet, producing a visible image on the image transfer sheet.

It is also possible to form full-color images by using a photosensitive sheet with a transparent base material coated with microcapsules. For example, use may be made of three kinds of light-curable agent, each having the property of hardening upon exposure to red, green or blue light. Each of these light-curable agents is encapsulated in the same microcapsules with a chromogenic agent capable of producing the color complementary to that to which the light-curable agent is sensitive such that the following three kinds of microcapsules are prepared: the Y-capsules encapsulating a light-curable agent which hardens upon exposure to light having wavelength of blue and a chromogenic agent capable of producing yellow which is complementary to blue, the M-capsules encapsulating a light-curable agent which hardens upon exposure to light having wavelength of green and a chromogenic agent capable of producing magenta which is complementary to green, and the C-capsules encapsulating a light-curable agent which hardens upon exposure to light having wavelength of red and a chromogenic agent capable of producing cyanic which is complementary to red. If a photosensitive sheet is prepared by uniformly coating a sheet-like transparent base material with these three types of microcapsules and if white light is projected onto a document to expose this photosensitive sheet to the reflected light, each light-curable agent inside a microcapsule hardens, corresponding to the amount of light in the corresponding wavelength range, thereby forming on the photosensitive sheet a latent image with color information. Next, such a photosensitive sheet is superposingly covered by an image transfer sheet coated with a developing agent having the property of reacting with each kind of chromogenic agents encapsulated in the microcapsules to thereby produce their intended colors and these sheets are compressed together. This causes those of the microcapsules containing an unhardened light-curable agent to rupture and the chromogenic agents encapsulated in such microcapsules flow out, reacting with the developing agent with which the image transfer sheet is coated and thereby producing colors. As a result, a full-color image corresponding to the one on the original document is formed on the image transfer sheet. In summary, if use is thus made of a photosensitive sheet with three kinds of microcapsules uniformly dispersed for coating its transparent base sheet, there is no need to decompose the full-color image on an original document into light beams in different wavelength ranges (such as blue, green and red) to which the light-curable agents in the microcapsules are sensitive. By this method, therefore, a latent image corresponding to the full-color image on an original document can be formed on a photosensitive sheet merely by projecting white light on the document and exposing the photosensitive sheet to the reflected light.

FIG. 3 shows the spectroscopic sensitivity characteristics of the light-curable agents encapsulated in the three kinds of microcapsules coating such photosensitive sheets. The light-curable agent for the Y-capsules which hardens mainly upon exposure to blue light is sensitive to light in a wavelength range of about 500 nm. The light-curable agent for the M-capsules which hardens mainly upon exposure to green light is sensitive to light in a wavelength range of about 480-600 nm. The light-curable agent for the C-capsules which hardens mainly upon exposure to red light is sensitive to light in a wavelength range of about 570-700 nm. Thus, the wavelength ranges in which the three light-curable agents of different kinds are sensitive to light overlap partially one another. In other words, light of wavelength in such an overlapped range causes more than one type of light-curable agent to harden. For example, both Y-capsules and M-capsules are hardened by exposure to light in the wavelength range of about 480500 nm and both M-capsules and C-capsules are hardened by exposure to light in the wavelength range of about 570-600 nm.

Examples of light source conventionally used for exposing photosensitive sheets for image formation include halogen tungsten lamps and xenon lamps. As can be seen in FIG. 4 which shows the radiation intensity characteristics of a halogen tungsten lamp, the light intensity from a halogen tungsten lamp increases with the wavelength. In other words, a halogen lamp emits light both in the wavelength range where the light-curable agents in Y-capsules and M-capsules are both sensitive and also in the wavelength range where the light-curable agents in M-capsules and C-capsules are both sensitive. As a result, a faithful color reproduction cannot be achieved in the case of an original purely of one of the three basic colors (blue, green and red) or of their complementary colors (yellow, magenta and cyanic) because some unwanted capsules are also hardened.

Another problem with light sources such as halogen tungsten lamps and xenon lamps which are used in forming images on photosensitive sheets is that the efficiency of light emission in the visible range is as low as about 20 Lm/W. Since the photosensitivity of the light-curable agents encapsulated in the microcapsules on ordinary photosensitive sheets is low, a high power is usually required to form an image by means of such a lamp. This results in the production of a large amount of heat and a special cooling device becomes necessary.

SUMMARY OF THE INVENTION

It is therefore an object of the present invention in view of the above to eliminate the problems of prior art image formation methods.

According to a method embodying the present invention by which the above and other objects can be achieved, image-forming light is projected onto a photosensitive sheet with a surface coated with microcapsules each encapsulating one of a plurality of kinds of light-curable agent which hardens upon exposure to light in a wavelength range and a specified chromogenic agent. Thereafter, an image transfer sheet with a surface coated with a developing agent having chromogenic effects on the chromogenic agents is superposed on the microcapsulecoated surface of the photosensitive sheet and these sheets are compressed together. The method of the present invention is characterized in that the photosensitive sheet is exposed to light from a source having its radiation intensity concentrated in each of the wavelength regions where the light-curable agents have their maximum photosensitivities. According to a preferred embodiment of the present invention, use is made of a metal halide lamp as the light source. According to another preferred embodiment of the present invention, the aforementioned light-curable agents are sensitive to light respectively in the wavelength range of red, green and blue which are three basic colors. According to still another preferred embodiment of the present invention, the chromogenic agents encapsulated in the microcapsules each produce the color which is complementary to the color of wavelength range of the light-curable agent contained in the same microcapsule.

By a method of the present invention, a faithful color reproduction is possible even if there is an overlapping among the sensitivity wavelength ranges of the microcapsules coating the photosensitive sheet because the exposure of the microcapsules to light in the overlapping wavelength ranges can be prevented. Moreover, the waste of energy can be reduced because the energy supplied to the light source is concentrated at the centers of the wavelength ranges where the microcapsules of different kinds are most photosensitive. As a result, the light emission efficiency of the light source is improved and the power consumption can be reduced. If the light emission efficiency of the light source is improved, the exposure time can be shortened and the speed of image formation can be increased.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1 is a schematic frontal sectional view of an example of copier which may use a method of image formation embodying the present invention, FIG. 2 is a graph showing the emission intensity characteristics of the light source used in the copier of FIG. 1, FIG. 3 is a graph showing the spectroscopic characteristics of light-curable agents encapsulated in microcapsules with which a photosensitive sheet is coated, and FIG. 4 is a graph showing the emission intensity characteristics of a halogen tungsten lamp.

DETAILED DESCRIPTION OF THE INVENTION

FIG. 1 shows schematically a copier with which a method of image formation embodying the present invention may be used, containing at one side near the bottom inside its housing a photosensitive sheet 1 wound up in the form of a roll such that the photosensitive sheet 1 can be pulled out horizontally from this position. The photosensitive sheet 1 has a sheet-like base material with one surface thereof coated with three kinds of uniformly distributed microcapsules, each microcapsule containing therein a light-curable agent which hardens upon exposure to light within a specified wavelength range and a chromogenic agent (colorless dye) which produces a specified color by reacting with a developing agent. The three types of microcapsule include the C-capsule encapsulating a light-curable agent which hardens upon exposure to light having wavelength of red and a chromogenic agent capable of producing cyanic which is complementary to red, the Y-capsule encapsulating a light-curable agent which hardens upon exposure to light having wavelength of blue and a chromogenic agent capable of producing yellow which is complementary to blue, and the M-capsule encapsulating a light-curable agent which hardens upon exposure to light having wavelength of green and a chromogenic agent capable of producing magenta which is complementary to green. The wavelength regions of light to which the light-curable agents encapsulated individually in the C-capsules, the Y-capsules and the M-capsules are photosensitive are, as shown in FIG. 3, less than about 500 nm for the light-curable agent in the Y-capsules, about 480-600 nm for that in the M-capsules and about 570-700 nm for the light-curable agent in the C-capsules. The centers of these regions are respectively about 450 nm, about 550 nm and about 650 nm.

The photosensitive sheet 1 wound in the form of a roll is pulled out horizontally by means of feed rollers 14 such that its microcapsule-coated surface faces in the upward direction. After passing the position of a cutter 11, the photosensitive sheet 1 is transported onto a conveyor belt 15. The cutter 11 serves to cut the incoming photosensitive sheet 1 into a specified length. The conveyor belt 15 serves to transport the photosensitive sheet 1 horizontally thereon towards a pressure developing device 6 comprised of a pair of pressure rollers defining a pressure point $P_2$ therebetween. Disposed above the upstream end of the conveyor belt 15 is an auxiliary exposure light source 10 for correcting the differences among the gamma characteristics (dynamic ranges) of the light-curable agents encapsulated in the aforementioned three kinds of microcapsules on the photosensitive sheet 1.

The upper part of the copier housing structure contains an optical system including a light source 3, reflective mirrors and a lens 4. The top surface of the housing structure comprises a glass platen 2 disposed horizontally for placing thereon a document to be exposed to the light source 3 of the optical system for copying. Reflected light from the document above the glass platen 2 is directed by means of the mirrors and the lens 4 of the optical system to an exposure point $P_1$ defined on the upper surface of the conveyor belt 15, thereby selectively hardening the light-curable agents encapsulated in the microcapsules on the photosensitive sheet 1 passing through the exposure point $P_1$. A latent image with color information corresponding to the image on the original document is thereby formed. The photosensitive sheet 1 with a latent image thus formed thereon is transported to the developing device 6 by means of the conveyor belt 15.

A paper cassette 5 containing image transfer sheets therein is disposed inside the housing structure but opposite from the side containing the photosensitive sheet 1. Each image transfer sheet has a surface of its sheetlike base material coated with a developing agent having chromogenic effects on the chromogenic agents (colorless dyes) encapsulated in the microcapsules with which the photosensitive sheet 1 is coated. The image transfer sheets inside the paper cassette 5 are transported out thereof one sheet at a time to the developing device 6 by means of a paper feed roller. After leaving the paper cassette 5, the image transfer sheet is temporarily stopped by timing rollers 13 which are driven at a specified timing schedule so as to transport the incoming image transfer sheet in synchronism with the arrival of the photosensitive sheet 1. At the developing device 6, the photosensitive sheet 1 and the image transfer sheet are transported together one on top of the other such that the microcapsule-coated surface of the photosensitive sheet 1 and the developing agent-coated surface of the image transfer sheet contact each other as these sheets pass through the pressure point $P_2$. At the pressure point $P_2$, the photosensitive sheet 1 and the image transfer sheet are compressed together as they are superposed one on top of the other such that those of the microcapsules on the photosensitive sheet 1 which were not hardened are ruptured, causing the chromogenic agents (colorless dyes) encapsulated therein to flow out thereof onto the image transfer sheet. The chromogenic agents which have spilled onto the image transfer sheet react with the developing agent with which the image transfer sheet is coated, thereby forming a color image on the image transfer sheet.

After passing through the developing device 6, the image transfer sheet is separated from the photosensitive sheet and is transported to heat rollers 7 for heating. After the chromogenic reaction on the image transfer sheet is accelerated by the heating with these heat rollers 7, the image transfer sheet is discharged onto a discharge tray 8.

In the meantime, the used photosensitive sheet 9 is discharged out of the housing structure by means of discharge rollers 12. If the surface of the image transfer sheet coated with the developing agent is also preliminarily coated with a thermoplastic resin, this resin is melted by the heat from the heat rollers 7 as the image transfer sheet is passed therebetween and lustre can be thereby provided to the color image formed on the image transfer sheet.

As explained above, the light-curable agents encapsulated in the Y-capsules, M-capsules and C-capsules coating the photosensitive sheet have sensitivity peaks respectively at wavelengths about 450 nm, about 550 nm and about 650 nm. In view thereof, the light source 3 of the optical system inside the housing structure comprises a metal halide lamp having emission characteristics as shown in FIG. 2, its intensity being concentrated at the wavelength regions where the light-curable agents encapsulated in the Y-capsules, M-capsules and C-capsules of the photosensitive sheet have sensitivity peaks. This metal halide lamp of the light source 3 is driven by a pulse current source.

Metal halide lamps having such emission characteristics with emission intensity concentrated in the aforementioned wavelength ranges corresponding to the three basic colors (blue, green and red) have been disclosed, for example, in U.S. Pat. Nos. 3,700,960, 3,840,767 and 3,876,895. Metal halide lamps use zinc iodide, lithium iodide and thallium iodide principally and the ratio of emission intensities at blue, green and red wavelength ranges can be varied by adjusting their contents. Their contents are varied according to the wavelength ranges corresponding to the peak sensitivity intensity of the light-curable agents encapsulated in the Y-capsules, M-capsules and C-capsules. Their contents are usually varied within the limits of 0.02–1.5 mg/cc for zinc iodide, 0.2–2.0 mg/cc for lithium iodide and 0.02–3 mg/cc for thallium iodide.

A copier described above by way of FIG. 1 was used to form images for evaluation. Use was made of photosensitive sheets uniformly coated with Y-capsules, M-capsules and C-capsules having sensitivity characteristics shown in FIG. 3 and a metal halide lamp with 0.65–0.75 mg/cc of zinc iodide, 0.15–0.20 mg/cc of lithium iodide and 0.10–0.19 mg/cc of thallium iodide. It was discovered that a copy with proper brightness is obtainable if the power supplied to the light source is 550 W and the scan speed of the document (and hence the exposure speed of the photosensitive sheet) is 6.0 mm/sec. It took document of size A4 at magnification 1. The color difference between the original document and the copy was $\Delta E = 5-10$ according to the CIEL 1976 $L^*a^*b^*$ uniform lightness chromaticness scale system. The difference was hardly discernible by visual observation. In other words, copies of excellent color quality could be obtained from a practical point of view.

By comparison, it took about 53 seconds to copy an original of size A4 by using as light source a halogen lamp with emission characteristics as shown in FIG. 4 with power supply of 800 W and scan speed of the original 4.0 mm/sec. Different kinds of original were used and color impurities were particularly visible in copying pure colors such as yellow, magenta, cyanic, red, green and blue in color photographs. The color differences in such cases were as high as $\Delta E = 20-40$.

The tests described above show that power can be saved (by 250W = 800W − 550W) if a method of the present invention is used. The speed of exposure scan can also be increased from 4.0 mm/sec to 6.0 mm/sec and this means an improvement by a factor of 1.5 (= 6.0/4.0) in the speed of image formation. Above all, the present invention makes it possible to obtain color copies of superior quality.

The foregoing description of a preferred embodiment of the invention has been presented for purposes of illustration and description. It is not intended to be exhaustive or to limit the invention to the precise form disclosed, and many modifications and variations are possible in light of the above teaching. Any such modifications and variations that may be apparent to a person skilled in the art are intended to be included within the scope of this invention.

What is claimed is:

1. In a method of image formation comprising the steps of projecting an image on a photosensitive sheet by light from a light source, said photosensitive sheet having a surface uniformly coated with three kinds of microcapsules including Y-microcapsules encapsulating therein a first light-curable agent which is hardenable by exposure to blue light and a first chromogenic agent which produces yellow, M-microcapsules encapsulating therein a second light-curable agent which is hardenable by exposure to green light and a second chromogenic agent which produces magenta, and C-microcapsules encapsulating therein a third light-curable agent which is hardenable by exposure to red light and a third chromogenic agent which produces cyanic, superposing an image transfer sheet and said photosensitive sheet one on top of the other, said image transfer sheet having a surface coated with a developing agent having chromogenic effects on said chromogenic agents, the surface of said photosensitive sheet coated with said microcapsules and the surface of said image transfer sheet coated with said developing agent being contacting each other, and compressing said superposed photosensitive sheet and image transfer sheet together, the improvement wherein said photosensitive sheet is exposed to light from a metal halide lamp which comprises zinc iodide, lithium iodide and thallium iodide and have such emission characteristics that emission intensity thereof is concentrated in wavelength ranges where said first, second and third light-curable agents have peak photosensitivities.

2. The method of claim 1 wherein content of zinc iodide is in the range of 0.02–1.5 mg/cc, content of lithium iodide is in the range of 0.15–2.0 mg/cc and content of thallium iodide is in the range of 0.02–3 mg/cc.

3. The method of claim 2 wherein content of zinc iodide is in the range of 0.65–0.75 mg/cc, content of lithium iodide is in the range of 0.15–0.20 mg/cc and content of thallium iodide is in the range of 0.10–0.19 mg/cc.

* * * * *